(12) United States Patent
Yamashita

(10) Patent No.: US 6,355,383 B1
(45) Date of Patent: Mar. 12, 2002

(54) ELECTRON-BEAM EXPOSURE SYSTEM, A MASK FOR ELECTRON-BEAM EXPOSURE AND A METHOD FOR ELECTRON-BEAM EXPOSURE

(75) Inventor: Hiroshi Yamashita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/511,312

(22) Filed: Feb. 23, 2000

(30) Foreign Application Priority Data

| Feb. 24, 1999 | (JP) | 11-047030 |
| Feb. 25, 1999 | (JP) | 11-048625 |
| Oct. 15, 1999 | (JP) | 11-294017 |
| Dec. 7, 1999 | (JP) | 11-347586 |

(51) Int. Cl.$^7$ .............. G03F 9/00; G03C 5/00
(52) U.S. Cl. .......... 430/5; 430/296; 430/942; 250/492.2; 250/492.22; 250/492.3
(58) Field of Search .............. 430/5, 296, 942; 250/492.2, 492.22, 492.3

(56) References Cited

FOREIGN PATENT DOCUMENTS

| JP | 3-101214 | 4/1991 |
| JP | 6-163371 | 6/1994 |
| JP | 8-124833 | 5/1996 |
| JP | 10-97055 | 4/1998 |
| JP | 10-274841 | 10/1998 |
| JP | 11-176720 | 7/1999 |

OTHER PUBLICATIONS

G.P. Watson et al., "A background dose proximity effect correction technique for scattering with angular limitation projection electron lithography implemented in hardware", pp. 2504–2507, J. Vac. Sci. Technol. B vol. 13, No. 6 Nov./Dec. 1995

*Primary Examiner*—Christopher G. Young
(74) *Attorney, Agent, or Firm*—Young & Thompson

(57) ABSTRACT

This invention provides a scattering-angle limiting type of electron-beam exposure system having a mask comprising a scattering region and a limiting aperture which limits the amount of scattered electrons passing through the mask, comprising a first limiting aperture fixed at or near a crossover plane and having a central opening and a closed elongated opening surrounding the central opening; and a second limiting aperture shiftable along an optical axis and having a central opening and a closed elongated opening surrounding the central opening, as well as an electron-beam exposure process using the system. This invention also provides a stencil type of mask suitable for the exposure system and the exposure process. According to this invention, proximity effect correction can be adjusted without significantly reducing a throughput and with excellent linewidth accuracy, especially in a patterning step in manufacturing a semiconductor device. The mask of this invention can be readily prepared with an accurate mask pattern, allowing pattern exposure to be conducted with improved resolution and accuracy.

21 Claims, 15 Drawing Sheets

Fig. 3        Prior Art (a)   (b)

Fig. 12  Prior Art
(a) 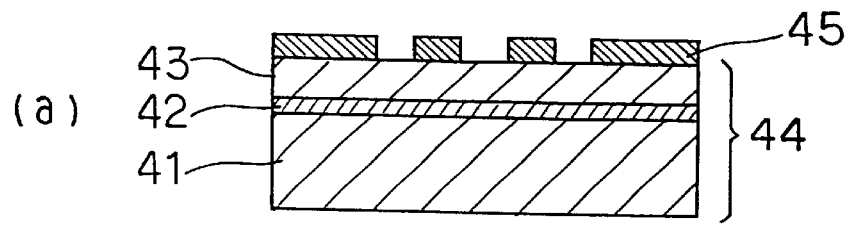
(b) 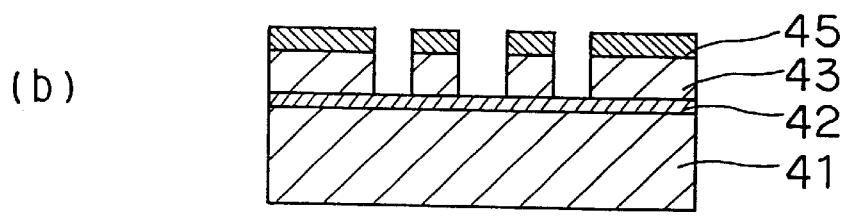
(c) 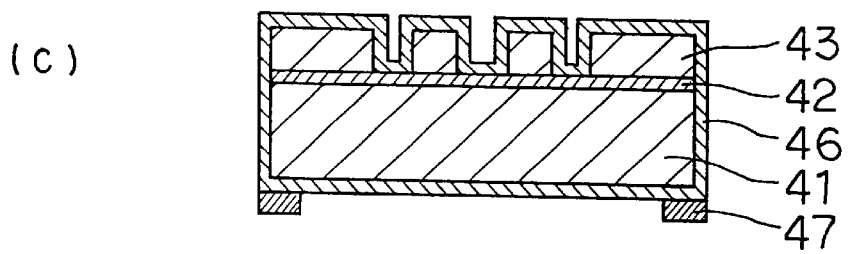
(d) 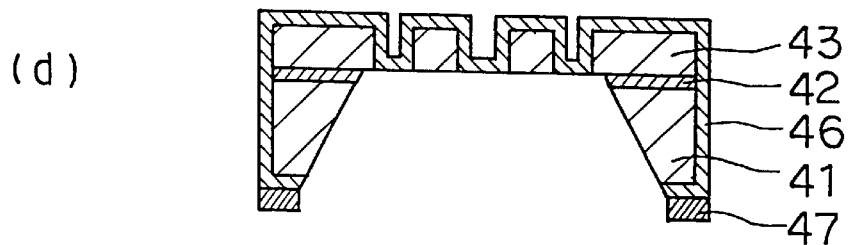
(e) 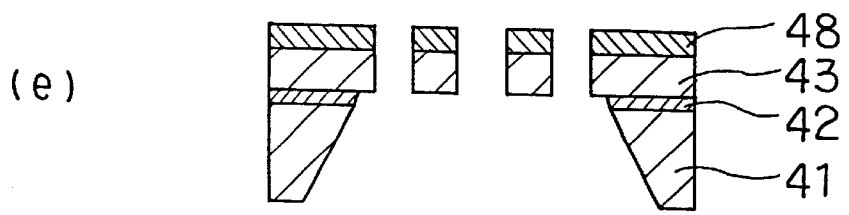

Fig. 14
(a) 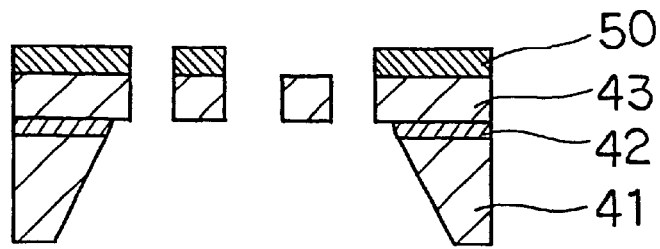
(b) 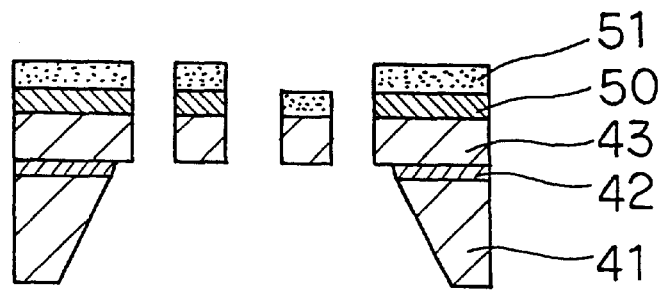
(c) 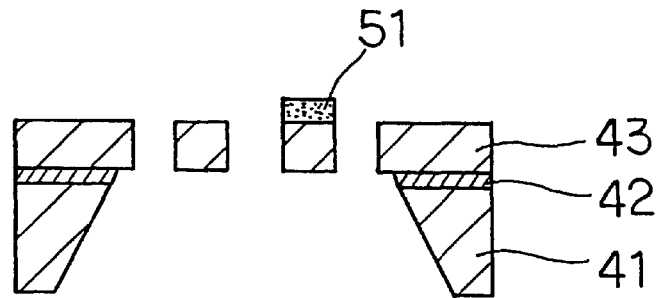

ELECTRON-BEAM EXPOSURE SYSTEM, A MASK FOR ELECTRON-BEAM EXPOSURE AND A METHOD FOR ELECTRON-BEAM EXPOSURE

BACKGROUND OF THE INVENTION

1. Field of the Invention

This invention relates to an electron-beam exposure system, a mask for electron-beam exposure and a method for electron-beam exposure, which are employed for manufacturing a semiconductor device. In particular, it relates to an electron-beam exposure system, a mask for electron-beam exposure and a method for electron-beam exposure, which are suitable for proximity effect correction.

2. Description of the Related Art

In electron-beam exposure, proximity effect due to scattered electrons in a resist layer and a substrate considerably affects a pattern linewidth accuracy. Proximity effect correction is, therefore, one of the most important technical elements.

In cell projection lithography which is the most popular electron-beam exposure process, a dose compensation method has been employed, which requires a complicated calculation by the self-consistent method using the exposure intensity distribution (EID) function or the pattern density method.

On the other hand, in scattering with angular limitation in projection electron-beam lithography which has attracted attention as a next-generation electron-beam exposure technique, proximity effect has been corrected by a compensation method using a part of scattered electrons as a correction beam to which GHOST technique is applied (i.e., SCALPEL® GHOST technique).

A scattering-angle limiting type of electron-beam exposure process employs a segmented transfer technique where a given pattern of a whole chip to be formed or one of its several regions are divided into a plurality of segments; a mask is made with a partial pattern for each segment; and using the masks, exposure is conducted for individual segments to transfer the partial patterns and finally to transfer the given pattern on a wafer.

A mask used for the scattering-angle limiting type of electron-beam exposure process is one in which a pattern consisting of an electron-beam scatterer is formed on an electron-beam transmittable membrane which does not significantly scatter electrons (hereinafter, referred to as a "scattering membrane mask"). A wafer is exposed to an electron beam which is not scattered or scattered with a relatively small angle after passing through the electron-beam transmittable membrane. Thus, the difference of electron-beam scattering between the membrane and the scattering regions permits a figural contrast to be formed on the wafer.

The proximity effect in the scattering-angle limiting type of electron-beam exposure process is corrected by selectively transmitting a part of electrons significantly scattered by the scatterer on the scattering membrane mask into an annular opening formed in a limiting aperture disposed at a crossover plane; defocusing the transmitted scattered electrons approximately to a back-scattering range by spherical and chromatic aberration of an object lens; and then irradiating the wafer with the electrons as a correction beam. Such a proximity effect correction technique has been reported in G. P. Watson et al., J. Vac. Sci. Technol., B, 13(6), 2504–2507 (1995). This method is characterized in that a proximity effect is corrected by performing correction exposure simultaneously with the pattern exposure, whereas in a conventional GHOST technique, a wafer is separately exposed to a defocused beam of a reverse pattern for an original exposure pattern. Thus, such proximity effect correction by simultaneous correction exposure with the pattern exposure may considerably contribute to improvement in a throughput.

The conventional proximity effect correction technique in a scattering-angle limiting type of electron-beam exposure process, however, has the following problem.

The extent of a proximity effect depends on a substrate type and a mask pattern. Therefore, when performing exposure using a substrate consisting of a different material or a mask having a different pattern, a correction dose must be readjusted for proximity effect correction suitable for the substrate or the mask. When using a mask having a different electron-scatterer thickness, a limiting aperture must be replaced to one with a different opening size. The correction dose is, however, adjusted by changing dimensions such as the size and the width of the annular opening formed in the limiting aperture. To optimize the correction dose, it is, therefore, necessary to prepare another limiting aperture, which must be then placed after stopping electron-beam exposure and breaking vacuum by opening the chamber in the air. Thus, there has been the problem that according to the conventional process, attempting to optimal proximity effect correction involves a significantly reduced throughput.

Furthermore, the above scattering membrane mask used in the conventional scattering-angle limiting type of electron-beam exposure process has the following problems.

First, since transmitted electrons are also scattered in an electron-beam transmittable membrane, the energy distribution of the image-forming electrons spreads, which causes chromatic aberration, leading to beam blur. For minimizing the beam blur, a beam convergent semi-angle must be reduced. Reduction in a beam convergent semi-angle, however, makes Coulomb effect significant, resulting in a reduced resolution. The Coulomb effect may be minimized by reducing a beam current. It, however, leads to a longer exposure and therefore a reduced throughput. Thus, a scattering membrane mask has not provide adequate electron exposure properties.

Second, the scattering membrane mask is prepared by forming, on a thin (about 100 nm) silicon nitride film, a thinner (about 50 nm) patterned heavy-metal film such as tungsten. Thus, its preparation is very difficult and is of a poor yield.

Besides the above problems, the above proximity effect correction technique has the following problem.

When an underlying pattern such as an interconnection consisting of a heavy metal such as tungsten is formed on a base layer in a resist layer on a wafer surface, image-forming electrons are reflected or back-scattered by the underlying pattern. As a result, there generates a difference of an extent in proximity effect between the resist region over the region without the underlying pattern and that over the region with the pattern. In the conventional proximity effect correction method, it has been difficult to adjust a correction dose for each region in response to the underlying pattern, and furthermore, no such attempts have been conducted.

A mask used in a conventional cell projection or a system used therein (a cell projection type of electron-beam exposure system) will be described.

A conventional cell projection (or exposure system) generally uses a mask which is prepared by forming an opening pattern on a substrate which blocks an electron beam, such as a silicon substrate having a thickness of at least 20 μm (hereinafter, referred to as a "stencil mask").

As a pattern has become finer in response to a more integrated semiconductor device, a stencil mask consisting of a thick substrate has become suffering from the following problem. In preparing a mask, it is difficult to accurately form an opening pattern on a silicon substrate as thick as at least 20 μm, leading to dimensional variation. Furthermore, in electron-beam exposure, the mask absorbs the electron beam and is thus heated, leading to its reduced durability, and is thermally expanded adequately to vary the mask position. In addition, it is required to increase an acceleration voltage for improving a resolution by reducing an aberration in the electron optical system, and therefore, the mask substrate has become thicker, causing these problems more significant.

A thinner mask may improve linewidth accuracy in the opening pattern and reduce heating while electrons to be blocked pass through the mask substrate region (non-opening region). As a result, a region in a wafer not to be exposed is exposed, leading to poor contrast and a reduced resolution.

For solving the problems, JP-A 10-97055 has disclosed a mask for electron-beam exposure prepared by a process comprising the steps of forming an opening pattern on a relatively thin mask substrate and forming an electron-beam scattering layer on the rear surface of the mask for scattering the electron beam passing through the mask. The electron-beam scattering layer may be a polycrystal layer such as polycrystal silicon, tungsten silicide, molybdenum silicide and titanium silicide, or a corrugated shape of layer. The specification describes that such an electron-beam scattering layer may be formed to scatter electrons passing through the pattern layer in the mask (non-opening substrate region) and to prevent them from reaching the wafer.

JP-A 6-163371 has disclosed an electron-beam drawing apparatus characterized in that an opening is formed on a substrate having a thickness shorter than an electron penetration depth to provide an electron-beam shaping aperture used as a mask and a mechanism for blocking scattered electrons passing through the substrate area of the shaping aperture (mask) is provided. In the disclosed invention, a mechanism for blocking scattered electrons passing through the substrate region of the shaping aperture is provided, i.e., a limiting aperture plate with a small opening size is provided in a crossover plane to transmit only an electron-beam passing through the mask opening and to remove electrons scattered in the mask substrate region. In addition, another blocking mechanism has been disclosed, in which an energy filter is formed to change the direction of decelerated electrons losing a part of their energy after passing through the mask substrate region, which is then removed by the limiting aperture.

JP-A 6-163371 has described that the above shaping aperture (mask) can solve the first problem in a mask used in an electron-beam projection lithography apparatus where a large shape transfer mask is exposed to a uniform electron beam to perform exposure for a large shape at one time, i.e., a mask prepared by forming a pattern consisting of a heavy metal which can considerably scatter an electron beam, on a relatively transparent film to an electron beam as a supporting layer.

SUMMARY OF THE INVENTION

An objective of this invention is to provide a scattering-angle limiting type of electron-beam exposure process and a scattering-angle limiting type of electron-beam exposure system where proximity effect correction can be adjusted without significant reduction in a throughput and with excellent linewidth accuracy.

Another objective of this invention is to provide a stencil-type mask whereby pattern exposure suitable for a scattering-angle limiting type of electron-beam exposure can be performed simultaneously with proximity effect correction. A further objective of this invention is to provide a mask which can be readily prepared with an accurate mask pattern and which allows pattern exposure to be performed with improved resolution and accuracy. A further objective of this invention is to provide a mask allowing proximity effect to be optimally corrected in accordance with an underlying pattern in a wafer.

Another objective of this invention is to provide an electron-beam exposure system and an electron-beam exposure process exhibiting excellent exposure performance with good resolution and pattern accuracy and allowing proximity effect to be corrected simultaneously with the pattern exposure, leading to an improved throughput. A further objective of this invention is to provide an electron-beam exposure system and an electron-beam exposure process allowing proximity effect to be optimally corrected in accordance with an underlying pattern in a wafer.

This invention provides a scattering-angle limiting type of electron-beam exposure system having a mask comprising a scattering region and a limiting aperture which controls the amount of scattered electrons passing through the mask, comprising a first limiting aperture fixed at or near a crossover plane and having a central opening and a closed elongated opening surrounding the central opening; and a second limiting aperture shiftable along an optical axis and having a central opening and a closed elongated opening surrounding the central opening.

This invention also provides a scattering-angle limiting type of electron-beam exposure system having a mask comprising a scattering region and a limiting aperture which limits the amount of scattered electrons passing through the mask, where the limiting aperture comprises a central opening and a closed elongated opening surrounding the central opening, and comprising a limiting-aperture changing member in which are disposed or fabricated a plurality of limiting apertures different in the size of the closed elongated opening; and a mechanism which operates the limiting-aperture changing member to dispose a desired aperture among the plurality of limiting apertures in the optical system.

This invention also provides a scattering-angle limiting type of electron-beam exposure system having a mask comprising a scattering region and a limiting aperture which limits the amount of scattered electrons passing through the mask, comprising a first limiting aperture having an opening only in its center and fixed in the optical system;

a limiting-aperture changing member in which are disposed or fabricated a plurality of second limiting apertures having an opening in their center with a size different from each other and larger than the outer diameter of the first limiting aperture; and a mechanism which operates the limiting-aperture changing member to dispose a desired second limiting aperture among the plurality of second limiting apertures on the axis of the first limiting aperture.

This invention also provides a scattering-angle limiting type of electron-beam exposure system having a mask comprising a scattering region and a limiting aperture which limits the amount of scattered electrons passing through the mask, comprising a first limiting-aperture changing member comprising a plurality of first limiting apertures having an opening only in their center, with a outer diameter different from each other;

a second limiting-aperture changing member in which are disposed or fabricated a plurality of second limiting apertures having an opening in their center with a size different from each other and larger than the outer diameters of the first limiting apertures; and a mechanism which operates the first and the second limiting-aperture changing members to dispose a desired first limiting aperture among the plurality of first limiting apertures and a desired second limiting aperture among the plurality of second limiting apertures on the same axis in the optical system.

This invention also provides a scattering-angle limiting type of electron-beam exposure process using the scattering-angle limiting type of electron-beam exposure system of this invention, comprising the step of shifting the second limiting aperture along the optical axis as long as the limiting aperture does not block the center of the electron-beam trajectory forming an image corresponding to the outermost periphery of the pattern on the mask, to adjust the amount of scattered electrons passing through the openings of the first and the second limiting apertures for controlling a correction dose and correcting proximity effect simultaneously with the pattern exposure.

According to this invention as described above, proximity effect correction can be readily adjusted and an improved throughput and excellent linewidth accuracy can be achieved, especially in a patterning step in manufacturing a semiconductor device.

This invention also provides an electron-beam exposure mask used in a scattering-angle limiting type of electron-beam exposure process comprising the step of using a mask having a scattering region to perform pattern exposure by means of a scattering contrast induced by difference in electron-beam scattering while utilizing a part of the scattered electrons by the mask to correct proximity effect, where a mask substrate has a scattering region with a thickness shorter than an electron penetration depth, which includes a region corresponding to a back-scattering range of the image-forming electrons in the wafer; and a patterned opening is formed in the scattering region.

This invention also provides the above electron-beam exposure mask where an electron scattering layer is formed at least in the scattering region in the mask substrate.

This invention also provides the above electron-beam exposure mask where the thickness of the scattering region varies depending on back-scattering to which the underlying pattern of the wafer contributes.

This invention also provides a scattering-angle limiting type of electron-beam exposure system comprising the above electron-beam exposure mask and a limiting aperture having a central opening and a closed elongated opening surrounding the central opening for limiting the amount of transmitted mask-scattered electrons, which can utilize a part of the scattered electrons to correct proximity effect simultaneously with the pattern exposure.

This invention also provides a scattering-angle limiting type of electron-beam exposure process comprising the step of using a mask having a scattering region to perform pattern exposure by means of a scattering contrast induced by difference in electron-beam scattering while utilizing a part of the scattered electrons by the mask to correct proximity effect, where the mask is prepared by forming a scattering region on a mask substrate, with a thickness shorter than an electron penetration depth, which includes a region corresponding to a back-scattering range of the image-forming electrons in the wafer; and forming a patterned opening in the scattering region.

This invention also provides the above electron-beam exposure process where the thickness of the scattering region varies depending on back-scattering to which the underlying pattern of the wafer contributes.

This invention as described above can provide a stencil-type mask suitable for a scattering-angle limiting type of electron-beam exposure process and allowing proximity effect to be corrected simultaneously with the pattern exposure. The mask of this invention can be readily prepared with an accurate mask pattern and allows pattern exposure to be of high resolution and high accuracy. Furthermore, this invention can provide a mask whereby proximity effect can be optimally corrected in accordance with an underlying pattern in a wafer.

In addition, this invention can provide an electron-beam exposure system and an electron-beam exposure process with an improved throughput and with higher resolution and pattern accuracy, allowing proximity effect to be corrected simultaneously with the pattern exposure. Furthermore, this invention can provide an electron-beam exposure system and an electron-beam exposure process, whereby proximity effect can be optimally corrected in accordance with an underlying pattern in a wafer.

BRIEF DESCRIPTION OF THE DRAWINGS

FIG. 12 is a process cross section for illustrating a process for manufacturing an electron-beam exposure mask according to the prior art.

FIG. 14 is a process cross section for illustrating a process for manufacturing an electron-beam exposure mask of this invention.

DETAILED DESCRIPTION OF THE PREFERRED EMBODIMENTS

This invention will be described in detail with reference to preferred embodiments.

Figure 1:
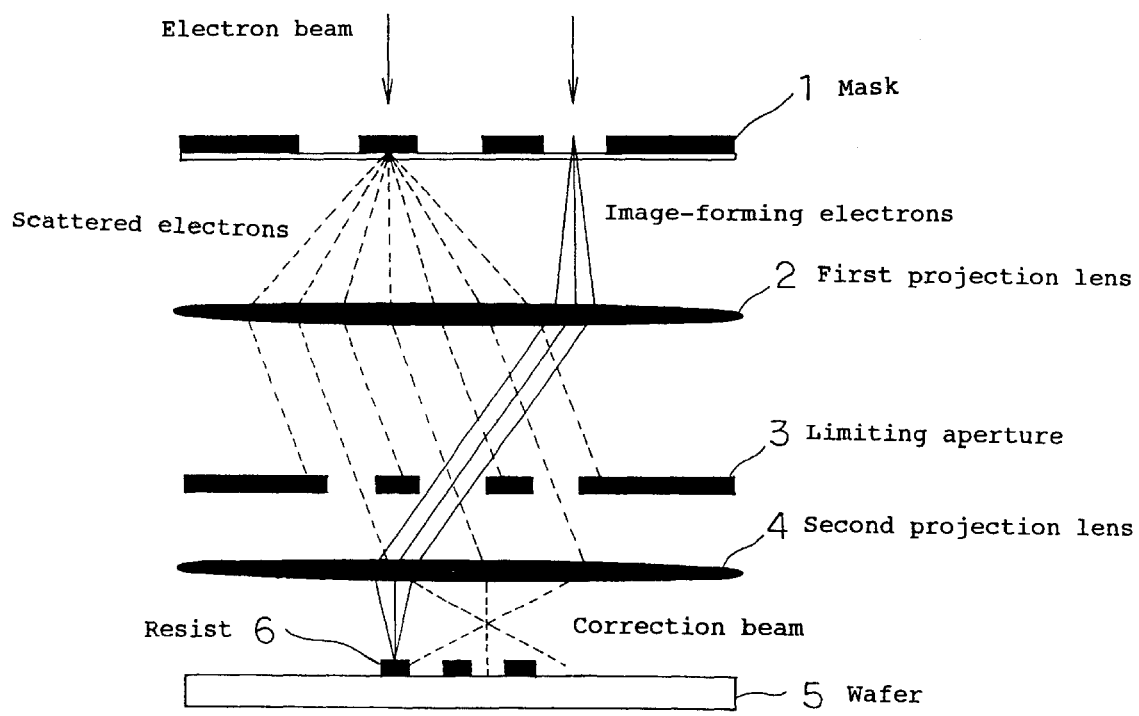
FIG. 1 is a conceptual diagram of an optical system for illustrating the basic concept in this invention.
Figure 6:
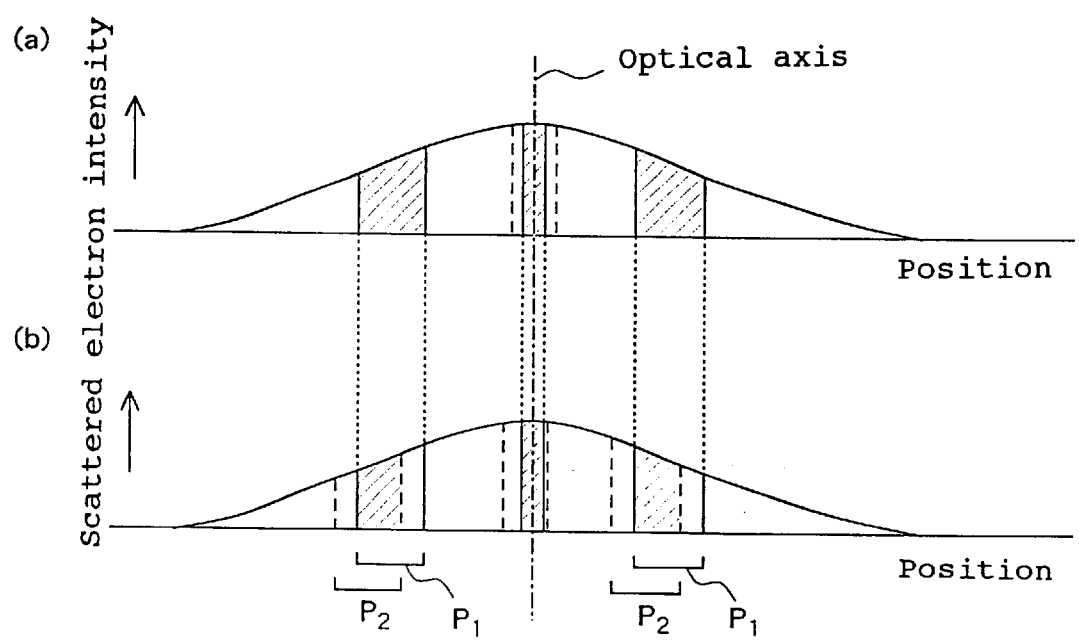
FIG. 6 is a conceptual diagram showing an intensity distribution of scattered electrons at a second limiting aperture in the optical system in FIG. 5.

The basic concept in this invention will be described with reference to the conceptual diagram for an optical system in FIG. 1. Image-forming electrons passing through a mask 1 are focused by a first projection lens 2, and then pass through a central opening in a limiting aperture 3 disposed at the crossover plane, i.e., back-focal plane to form an image on a resist 6 on a wafer 5 by a second projection lens 4 as an object lens. The resist 6 in FIG. 6 is a negative type, in which an irradiated region remains, and the figure shows a shape after development for illustration. A positive resist may be used in this invention. The first and the second projection lenses constitute a doublet optics.

On the other hand, most of electrons scattered by the mask 1 are blocked by the limiting aperture 3 and a part of the electrons pass through the central opening and the closed elongated opening surrounding the central opening. The transmitted scattered electrons are defocused to about a back-scattering range by the spherical and the chromatic aberrations of the second projection lens 4 (object lens), to impinge on the wafer as a correction beam. The central and the closed elongated openings are cocentrically disposed and the closed elongated opening may be annular or polygonal such as rectangular and square. It is generally annular, but may be polygonal such as rectangular and square in the light of an aperture material and manufacturing conditions. A rib is generally provided for connecting the periphery with the inside of the closed elongated opening. As long as desired proximity effect correction can be performed, the rib may be broadened to make the closed elongated opening partially closed.

When the limiting aperture is fixed at the crossover plane, the intensity of the correction beam (the correction dose in proportion to the intensity) is adjusted by changing the area of the closed elongated opening. The range of defocusing is adjusted by changing the distance of the closed elongated opening from the limiting aperture center; for an annular opening, by changing its size. Since an opening area is larger in the closed elongated opening than in the central opening, the proximity effect correction is almost dependent on the scattered electrons passing through the closed elongated opening in the light of an angle distribution in the scattered electrons.

A mask used in this invention may be the above scattering membrane mask where a pattern consisting of an electron-beam scatterer is formed on an electron-beam transmittable membrane which does not significantly scatter electrons. The membrane preferably comprises a light element which does not significantly scatter electrons; for example, SiN and SiC. The scatterer may be made of a heavy metal which tends to scatter an electron beam, such as tungsten, tantalum, chromium, molybdenum, titanium, gold and platinum. The membrane of the mask has a thickness in the range of about 0.1 to 0.2 $\mu$m at an accelerating voltage of 100 kV.

The mask used in this invention may be a scattering stencil mask described later.

The basic principle of proximity effect correction will be described with reference to FIGS. 2 and 3.

Figure 2:
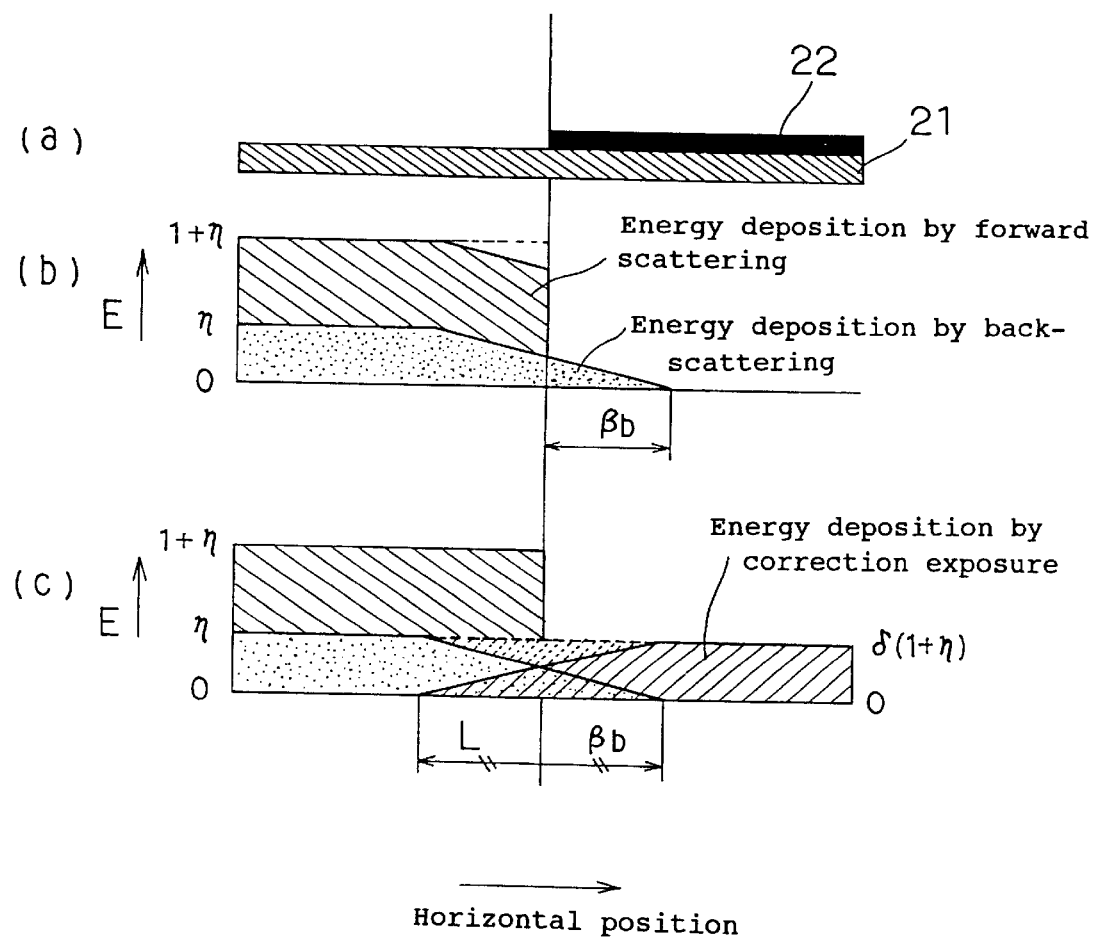
FIG. 2 is a conceptual diagram for illustrating the basic principle of proximity effect correction in this invention.

FIG. 2($a$) shows a scattering membrane mask, where 21 is a membrane and 22 is a scatterer. FIG. 2($b$) shows a distribution of energy deposition in the resist on the wafer when using a limiting aperture without a closed elongated opening and using no correction beams, i.e., without proximity effect correction, while FIG. 2($c$) shows a distribution of energy deposition when using a limiting aperture with a closed elongated opening and using a correction beam, i.e., with proximity effect correction. In these figures, $\beta$b is a back-scattering range. Assuming the energy of the forward-scattering electrons is 1, the back-scattering electrons have an energy corresponding to the back-scattering coefficient $\eta$. The value $\eta$ must be compensated by correction exposure; specifically, $\eta/(1+\eta)$ (correction dose ratio; $\delta$) of the electrons passing through the scatterer must impinge on the wafer.

The correction beam may be defocused to about the back-scattering range $\beta$b, i.e., L, to give a constant deposition energy as shown in FIG. 2($c$), which has been reduced near the border line in FIG. 2($b$). As a result, a linewidth accuracy of the pattern can be improved. As the width of the closed elongated opening in the limiting aperture increases, i.e., the opening area increases, the correction dose increases, and as the size of the closed elongated opening increases, the aberration increases and defocusing may become wider.

Figure 3:
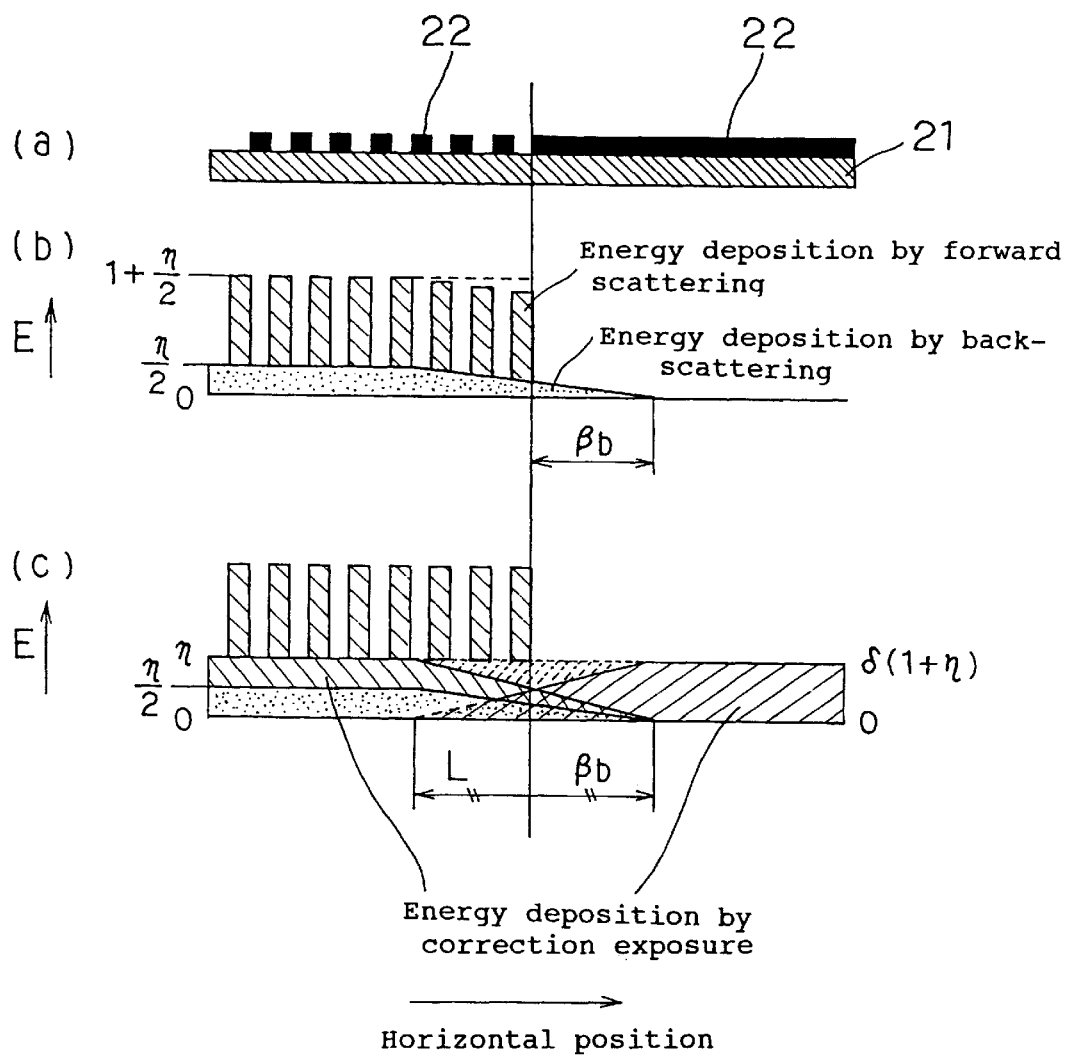
FIG. 3 is a conceptual diagram for illustrating the basic principle of proximity effect correction in this invention.

In FIG. 3, the scattering membrane mask in FIG. 2($a$) is replaced with a 1:1 line-and-space pattern, i.e., there is formed a pattern with a pattern density of 50%. It is apparent from FIG. 3 that even when the pattern density is changed, proximity effect may be similarly corrected, and that there is no need to separately perform correction exposure of a reverse pattern requiring a complicated calculation whenever the pattern is changed as in a conventional GHOST technique.

The basic concept of this invention and the basic principle of proximity effect correction have been described. Then, the characteristic concept and principle of this invention will be described with reference to FIGS. 4 to 6.

In the prior art, the limiting aperture 3 is fixed at the crossover plane $S_0$ because at the crossover plane (back-focal plane), image-forming electrons which are not scattered or scattered to a small degree and which contribute to image formation can pass through the central opening in the limiting aperture without being blocked by the limiting aperture 3. If the limiting aperture is excessively shifted along the axis, the image-forming electrons are blocked by the limiting aperture and thus the periphery of the image is eclipsed. The phenomenon will be described with reference to FIG. 4. The limiting aperture 3 is shifted upward from $S_2$, the electron-beam trajectory forming an image corresponding to the outermost periphery of the pattern is almost totally blocked and thus the periphery of the image is eclipsed. Therefore, in the prior art, it is necessary to fix the limiting aperture at the crossover plane. Furthermore, there is no need to move the limiting aperture in the process of the prior art, and thus fixing the limiting aperture has been an undoubtedly common technique.

On the other hand, the inventor has taken into consideration scattered electrons contributing to proximity effect correction as well as image-forming electrons, and have finally found that since a spatial distribution of the scattered electron intensity (the amount of the scattered electrons) varies depending on a position in the direction of the optical axis, the amount of the transmitted scattered electrons can be changed by shifting the limiting aperture along the optical axis from the crossover plane.

This invention provides a scattering-angle limiting type of electron-beam exposure system having a mask comprising a scattering region and a limiting aperture which limits the amount of scattered electrons passing through the mask, comprising a first limiting aperture fixed at or near a crossover plane and having a central opening and a closed elongated opening surrounding the central opening; and a second limiting aperture shiftable along an optical axis and having a central opening and a closed elongated opening surrounding the central opening.

The second limiting aperture may be shifted along the optical axis in accordance with a desired correction dose by, for example, providing a mechanism which can adjust the position of the second limiting aperture on the optical axis as long as the second limiting aperture does not block the center of the electron-beam trajectory forming an image corresponding to the outermost periphery of the pattern on the mask.

In this invention, besides the first limiting aperture fixed at or near the crossover plane, the second limiting aperture shiftable on the optical axis is provided. The second limiting aperture may be shifted along the optical axis to adjust the amount of scattered electrons passing through the closed elongated openings in both limiting apertures, i.e., the correction dose can be adjusted.

Figure 5:
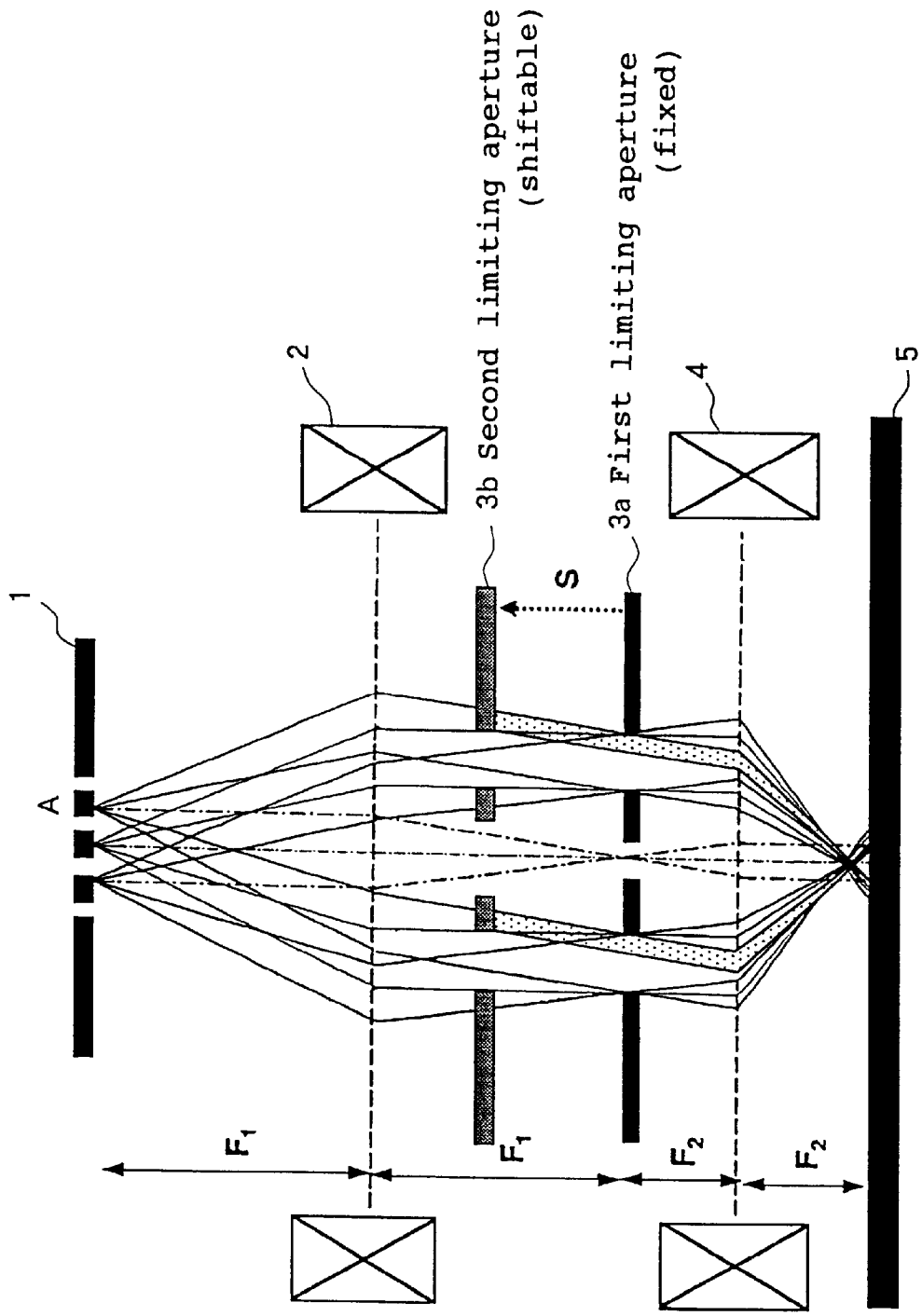
FIG. 5 is a conceptual diagram of an optical system for illustrating a process for adjusting proximity effect correction in this invention.

FIG. 5 shows an optics where a first and a second limiting apertures 3a, 3b are disposed, and the trajectory of scattered electrons emitted from a mask 1. The closed elongated opening in the second limiting aperture 3b has the same shape (annular) and size as that in the first limiting aperture 3a. The opening in the center of the second limiting aperture 3b (central aperture) has a slightly larger size than that of the first limiting aperture 3a.

Considering the scattered electrons from A in the mask 1 in FIG. 5, it is apparent that without the second limiting aperture 3b, the scattered electrons which can pass through the annular opening in the first limiting aperture 3a are blocked by the second limiting aperture 3b. It is due to a shift in relative positional relationship between the annular openings of the first and the second limiting apertures 3a, 3b in a spatial intensity distribution for scattered electrons at the position of the first limiting aperture 3a.

Such a shift in relative positional relationship between annular openings will be detailed with reference to FIG. 6. FIG. 6 shows a spatial intensity distribution for scattered electrons at the position of the first limiting aperture 3a fixed at the crossover plane. In FIG. 6(a), the first and the second limiting apertures 3a, 3b are overlapped at the same position. The hatched areas in both sides are due to scattered electrons passing through the annular openings in the limiting apertures, while the central hatched area is due to scattered electrons passing through the central opening in the limiting apertures. The number of electrons reaching the wafer can be calculated by multiplying the distribution by $\pi r^2$. The number of scattered electrons passing through the central opening is, therefore, small and contrast deterioration is not significant. Since the annular openings in the first and the second limiting apertures have the same shape and size, the intensity distribution ranges for the scattered electrons passing through the annular openings in the first and the second limiting apertures are totally overlapped. For the central openings in the limiting apertures, the central opening in the second limiting aperture is at the position indicated by the dotted line because the central opening in the second limiting aperture is slightly larger than that in the first limiting aperture.

On the other hand, in FIG. 6, the second limiting aperture 3b is shifted upward along the optical axis from the position of the first limiting aperture 3a by a distance S as shown in FIG. 5. The dotted line in FIG. 6(b) indicates the position of the opening in the second limiting aperture 3b. In FIG. 6(b), the second limiting aperture 3b is shifted along the optical axis, so that the position of the annular opening in the second limiting aperture 3b ($P_2$) is shifted to the left in relation to the position of the annular opening in the first limiting aperture 3a ($P_1$). Thus, the amount (intensity) of scattered electrons passing through both openings in the first and the second limiting apertures is indicated by the hatched areas where the area corresponding to the opening position $P_1$ is overlapped with the area corresponding to the opening position $P_2$, and which is reduced in comparison with FIG. 6(a). Thus, a correction dose can be controlled by shifting the second limiting aperture 3b along the optical axis.

However, as described above, excessive shifting the limiting aperture may cause eclipse of the periphery of the image or deterioration of linewidth accuracy due to an inadequate image-forming electrons on the wafer. Therefore, the limiting aperture is shifted along the optical axis or the central opening size of the limiting aperture is set as long as such problems can be avoided. In other words, it is necessary in this invention to shift the limiting aperture within the range where it does not block the center of the trajectory for image-forming electrons corresponding to the outermost periphery of the pattern on the mask. Within the range (from $S_0$ to $S_1$ in FIG. 4), the resist on the wafer may be irradiated with image-forming electrons with an adequate energy deposition and the correction dose by the scattered electrons may be adjusted to a desired value. Although the second limiting aperture is shifted upward from the first limiting aperture in the embodiment in FIG. 5, the second limiting aperture may be shifted downward from the first limiting aperture.

Figure 4:
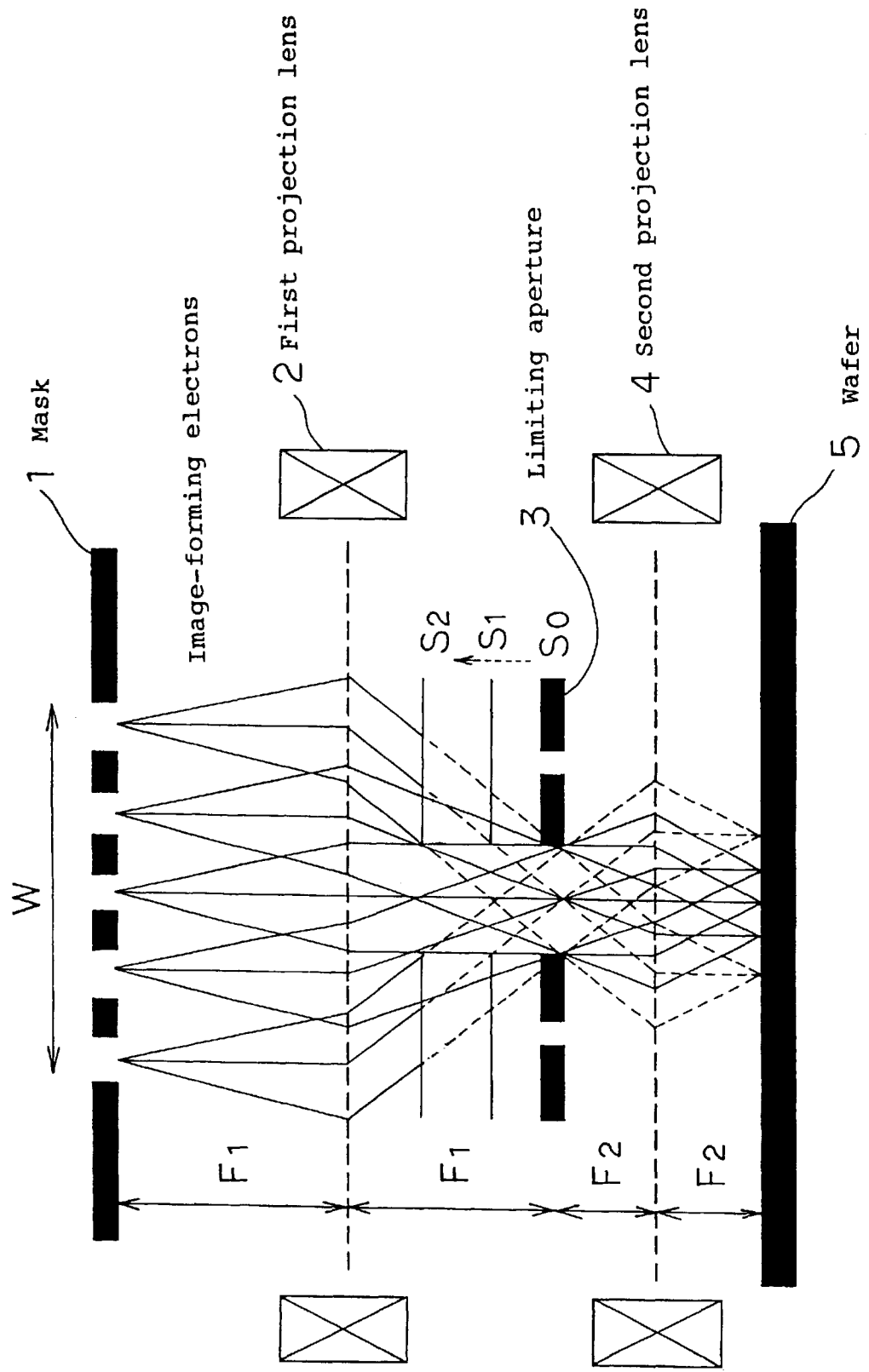
FIG. 4 is a conceptual diagram of an optical system for illustrating a process for adjusting proximity effect correction in this invention.

It is preferable that the size of the central opening (central opening size) in the second limiting aperture to be shifted is larger than the central opening size in the first limiting aperture to be fixed for further avoiding blocking of image-forming electrons by shifting the second limiting aperture. The central opening size of the second limiting aperture may be set within the range where it is physically included inside the closed elongated opening (smaller than an inner diameter for an annular opening). As seen in FIG. 4, increasing the central opening size can enlarge the range where the image-forming electrons can pass through, and thus enlarge the range where the second limiting aperture can be shifted. As a result, a correction dose can be varied within a broader range.

Although the shape and size of the closed elongated opening in the second limiting aperture are the same as or almost the same as those in the first limiting aperture, they can be appropriately changed as long as it does not prevent adjustment to a desired correction dose.

There has been described adjustment of a correction dose by shifting a limiting aperture along the optical axis, but additionally, the crossover plane may be shifted by changing excitation of the first projection lens 1 as long as the limiting aperture does not block the center of the trajectory for image-forming electron-beam corresponding to the outermost periphery of the pattern on the mask. Shifting the crossover plane along the optical axis may allow the correction dose to be finely adjusted after positioning the second limiting aperture.

In this invention, within "the range where the limiting aperture does not block the center of the trajectory for image-forming electron-beam corresponding to the outermost periphery of the pattern on the mask", it is ensured that the intensity of the electron-beam forming an image corresponding to the outermost periphery of the pattern on the mask (image-forming electron intensity $I_s$) is at least about 50% of that when the limiting aperture is at the crossover plane $S_0$. In this invention, the image-forming electron intensity $I_s$ is preferably at least 70%, more preferably at least 80%, further preferably at least 90%. It is preferable in this invention to adjust the correction dose while keeping the image-forming electron intensity as high as possible. Even when the image-forming electron intensity $I_s$ is 95% or higher, the correction dose may be adequately adjusted. As described above, the central opening size in the second limiting aperture larger than that in the first limiting aperture allows image-forming electrons blocked by the second limiting aperture to be reduced or eliminated even when the correction dose can be varied in a wider range, i.e., the shift for the second limiting aperture increases, and thus an adequate image-forming electron intensity may be ensured.

This invention will be described with specific numerical values with reference to FIG. 4. When a beam convergent semi-angle d=5 mrad, F1=160 mm, F2=40 mm and a mask-pattern width W=1 mm, 0.7 mm may be selected for the central opening radius in the second limiting aperture to ensure an adequate variation range for the correction dose, without blocking the image-forming electrons.

Figure 7:
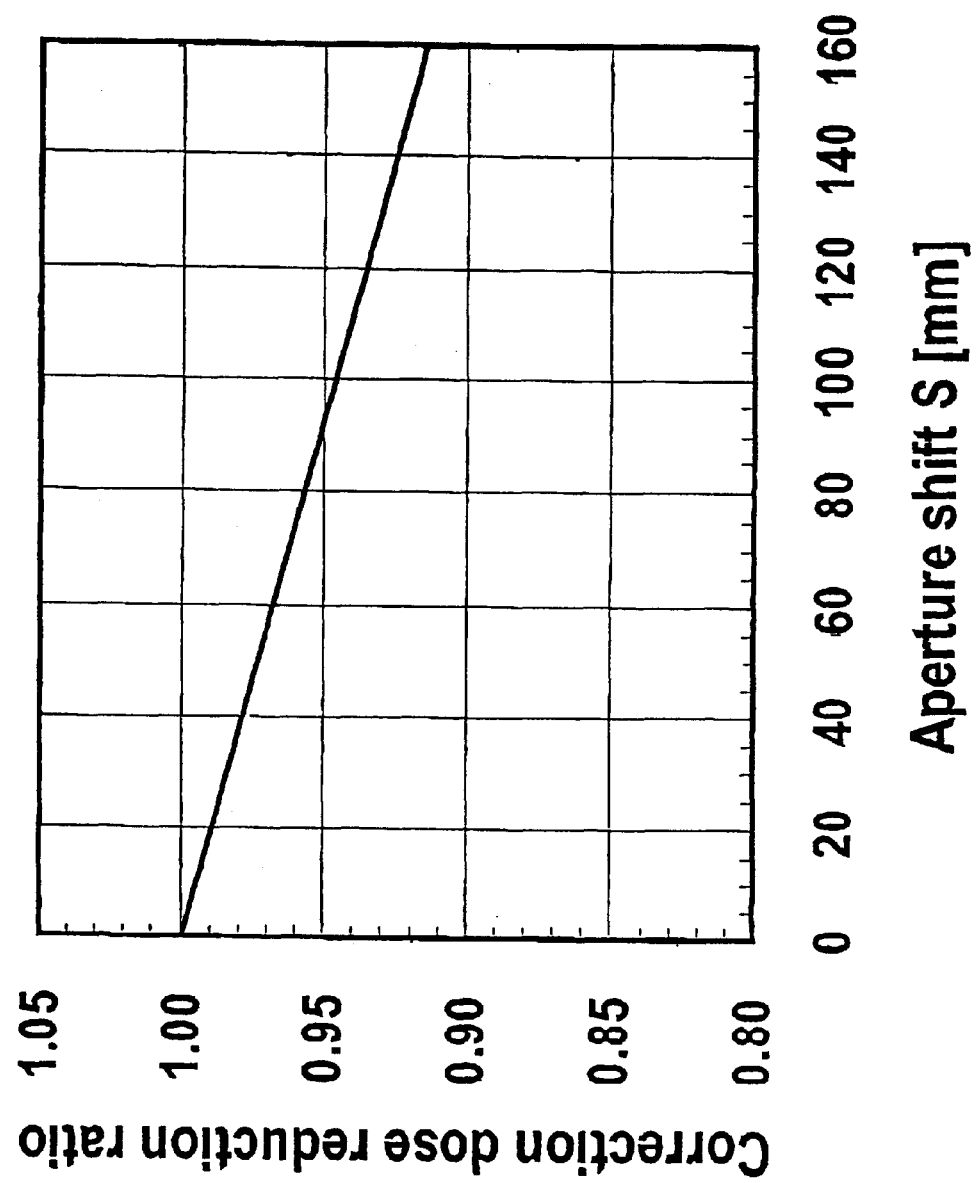
FIG. 7 is a graph showing correction dose vs a limiting aperture shift in an embodiment of this invention.

FIG. 7 shows a variation of the scattered electron intensity (correction dose) passing through the annular opening vs a shift S for the second limiting aperture. The ordinate indicates a correction dose ratio assuming that the correction dose is 1 at the crossover plane $S_0$. The first limiting aperture has a central opening size (radius): 0.2 mm, an annular-opening outer size (radius): 7.04 mm, an annular-opening inner size (radius): 2.24 mm, an annular-opening width: 4.8 mm, while for the second limiting aperture, a central opening size (radius) is 0.7 mm and the outer size (radius), the inner size (radius) and the width for an annular opening are as indicated for the first limiting aperture. For example, when the second limiting aperture shift S is 95 mm, it can be seen from FIG. 7 that the correction dose is reduced by about 5% (the image-forming electron intensity is kept at 100%).

There has been described proximity effect correction through adjustment of a correction dose by controlling the amount of scattered electrons passing through the openings in the first and the second limiting apertures. A limiting-aperture changing mechanism will be described, which is equipped with a plurality of limiting apertures and can readily change these apertures without breaking vacuum. These approaches may be conducted alone or in combination. When these are combined, it is preferable to use a limiting-aperture changing mechanism described below in place of a first limiting aperture fixed at or near a crossover plane.

Figure 8:
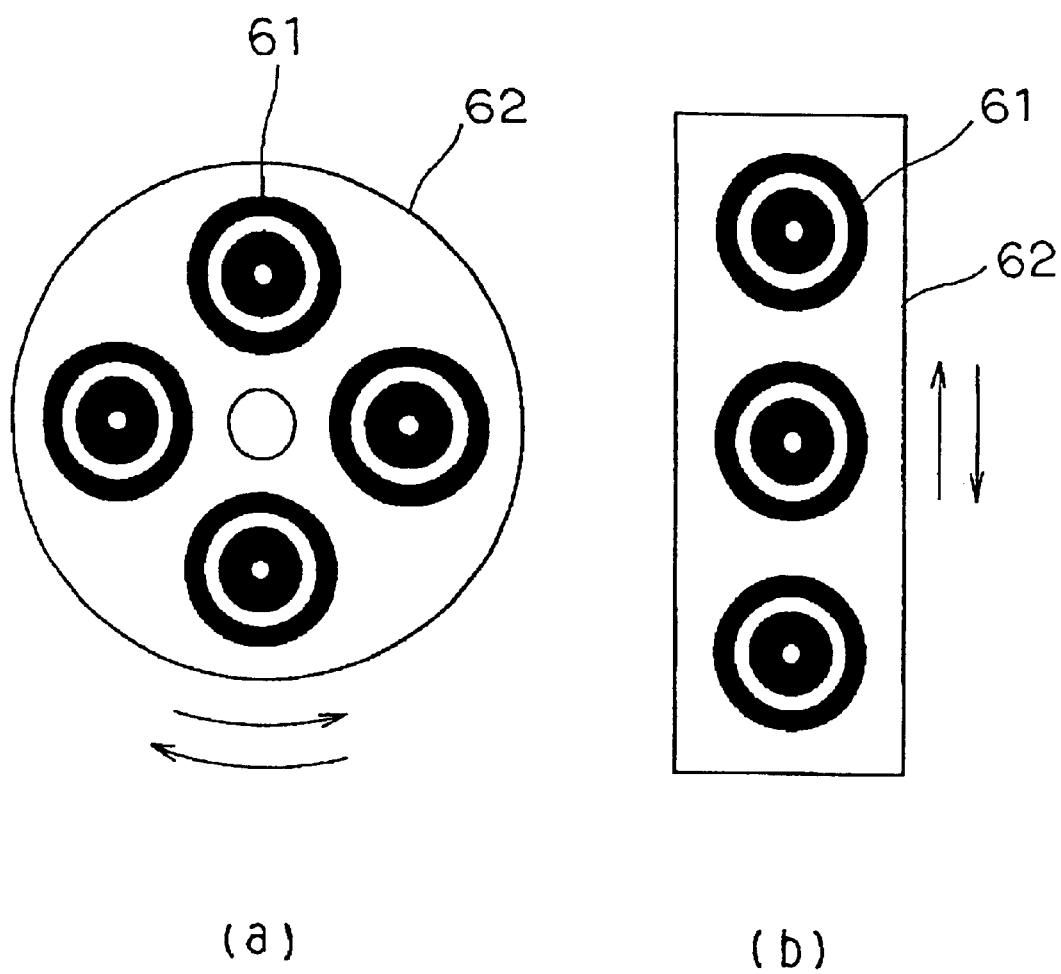
FIG. 8 illustrates a limiting aperture in an electron-beam exposure system of this invention.

FIG. 8 is a plan view showing an embodiment a limiting-aperture changing member 62 in which there are placed or fabricated a plurality of limiting apertures 61 having different closed elongated opening sizes from each other. It is designed to allow a desired limiting aperture among the plurality of limiting apertures to be disposed in the optical system by revolving the member to one of the directions indicated by the arrows (revolver type)(FIG. 8(a)) or by shifting the member to one of the directions indicated by the arrows (slide type)(FIG. 8(b)).

Although a rib is generally provided for connecting the periphery with the inside of the closed elongated opening, the rib may be broadened to make the closed elongated opening partially closed.

Figure 9:
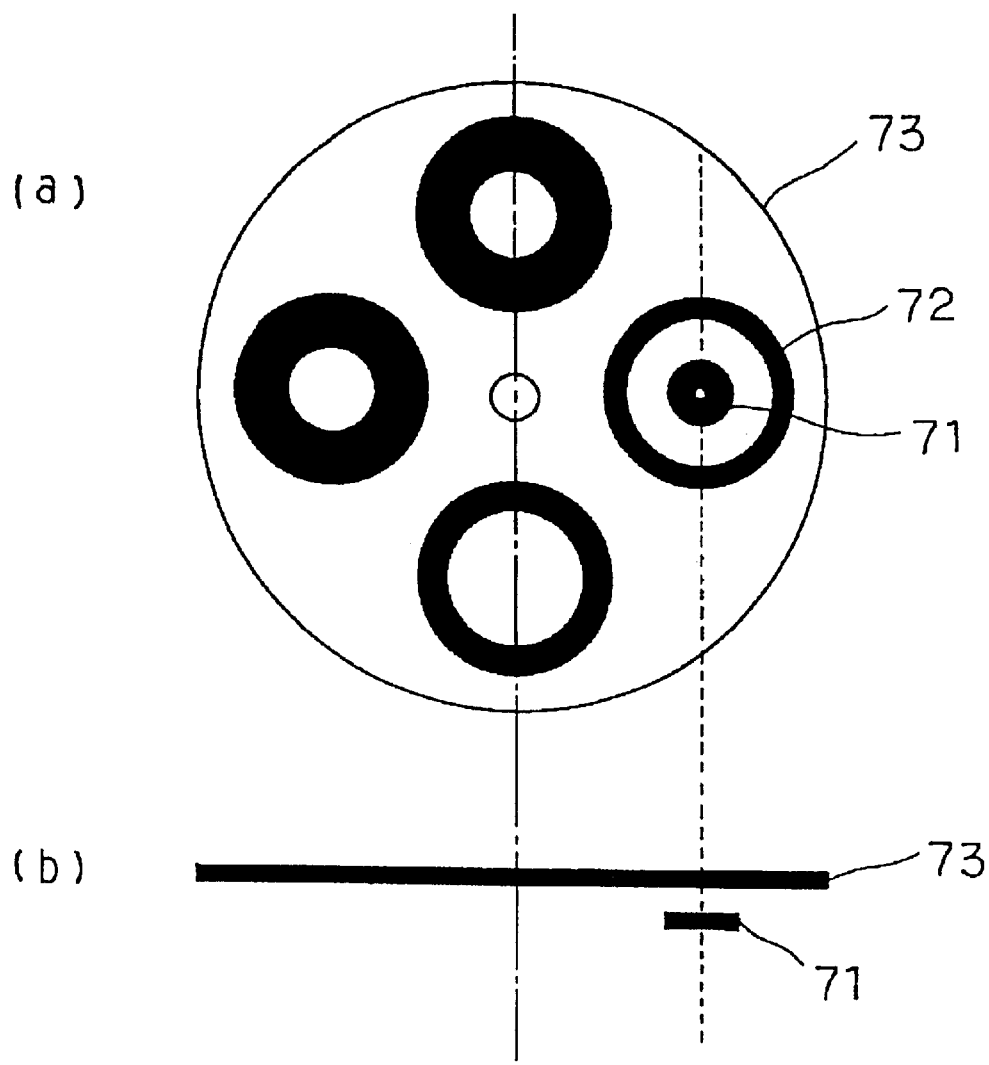
FIG. 9 illustrates a limiting aperture in an electron-beam exposure system of this invention.

FIG. 9 shows another embodiment, where FIGS. 9(a) and 9(b) are a plan view and a side view, respectively. The first limiting aperture 71 has an opening in its center and is fixed in the optical system. The second limiting apertures 72 have a central opening having an inner diameter larger than the outer diameter of the first limiting aperture 71. These second limiting apertures having different opening sizes from each other are disposed or fabricated in a single limiting-aperture changing member 73. The first and the second limiting apertures can be disposed on the same axis to provide a limiting aperture apparently having a central opening and an annular opening surrounding the central opening, capable of correcting proximity effect. The width of the annular opening can be changed by revolving the limiting-aperture changing member 73 to select a desired second limiting aperture.

Another embodiment may be employed, comprising a first limiting-aperture changing member comprising a plurality of first limiting apertures having an opening only in their center, with an outer diameter different from each other; a second limiting-aperture changing member in which are disposed or fabricated a plurality of second limiting apertures having an opening in their center with a size different from each other and larger than the outer diameters of the first limiting apertures; and a mechanism which operates the first and the second limiting-aperture changing members to dispose a desired first limiting aperture among the plurality of first limiting apertures and a desired second limiting aperture among the plurality of second limiting apertures on the same axis in the optical system.

Using the above limiting-aperture changing mechanism, a limiting aperture may be selected from a variety of alternatives without opening the system to the air by breaking vacuum, and a correction dose or an extent of defocusing through aberration for proximity effect correction may be properly adjusted.

An electron-beam exposure mask (hereinafter, referred to as a "scattering stencil mask") of this invention will be described.

Figure 10:
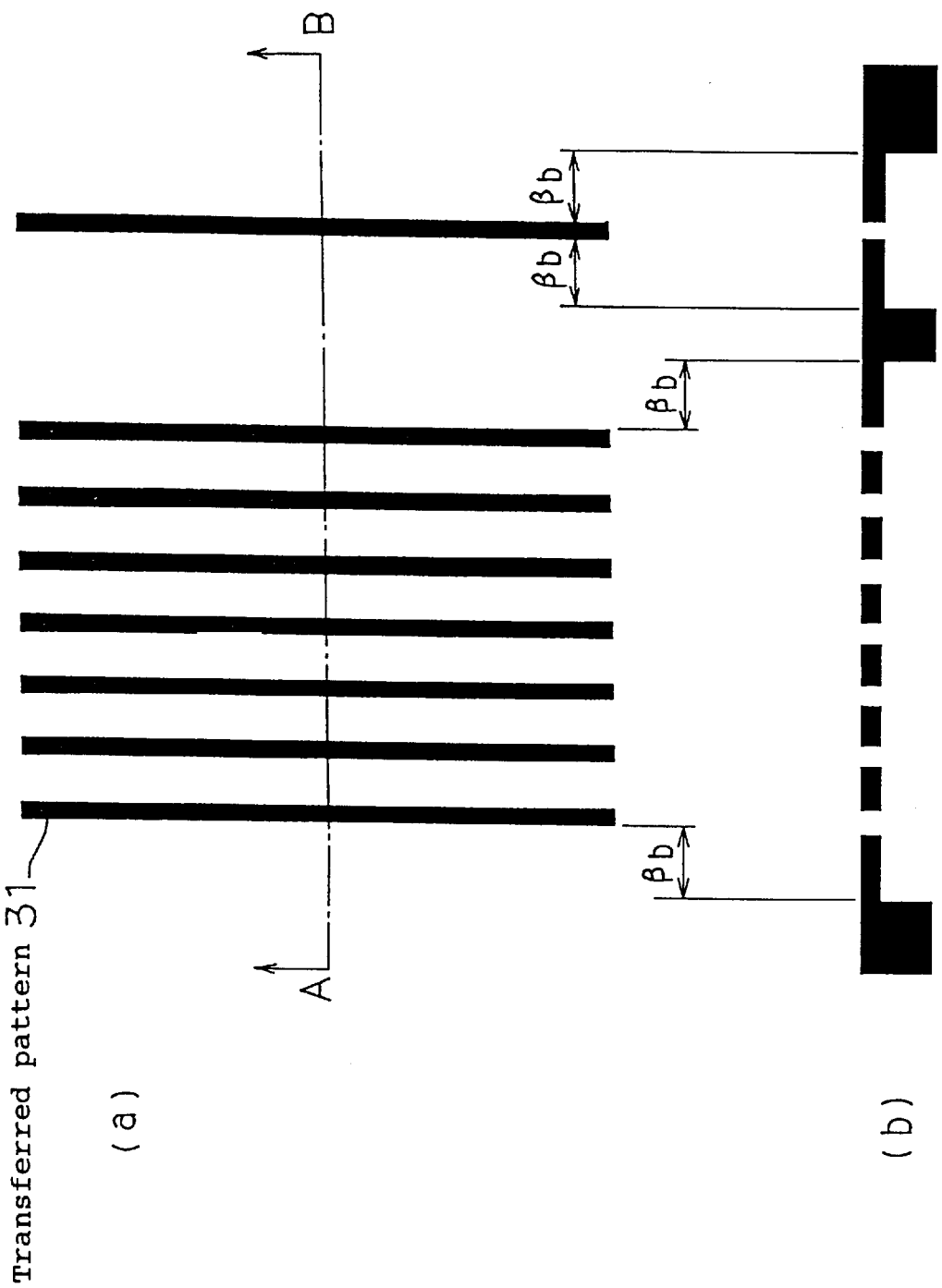
FIG. 10 illustrates the structure of an electron-beam exposure mask of this invention.

FIG. 10 illustrates an embodiment of the scattering stencil mask of this invention. FIG. 10(a) shows a transferred pattern 31 for a line-and-space, while FIG. 10(b) shows a cross section of the mask taken on line A–B in FIG. 10(a). In these figures, βb is a back-scattering range. The ratio of the transferred pattern size:the mask size is set to 1:1 to clearly indicate a relationship between the transferred pattern and the mask.

The scattering stencil mask of this invention is a stencil mask where a mask substrate is provided a patterned opening and the mask substrate has a scattering region with a thickness shorter than an electron penetration depth, which includes a region corresponding to a back-scattering range βb of the image-forming electrons in the wafer.

The substrate of such a scattering stencil mask may made of silicon or a metal such as tungsten and molybdenum, most preferably silicon.

The opening pattern in the scattering stencil mask is formed in a scattering region thinner than the electron penetration depth for the mask substrate. Electrons passing through the opening impinge on the wafer as image-forming electrons, while electrons penetrating the thinner region of the substrate (the scattering region) become scattered electrons, most of which are blocked by the limiting aperture at the crossover plane. Thus, a figural contrast is formed on the wafer On the other hand, a part of the scattered electrons passing through the closed elongated opening in the limiting aperture impinge on the wafer as a correction beam, to correct proximity effect.

The thickness of the scattering region in the scattering stencil mask according to this invention is selected to adequately transmit and scatter an electron beam. The upper limit for the thickness of the scattering region must be thinner than the electron-beam range (electron penetration depth), preferably thinner than ½ of the electron penetration depth, It is preferably up to 25 times, more preferably up to 15 times, further preferably 10 times of the mean free pass. The lower limit for the thickness of the scattering region must be thicker than the mean free pass; preferably at least 1.5 times, more preferably at least 2 times, further preferably at least 3 times of the mean free pass. Since the electron penetration depth and the mean free pass considerably depend on a mask-substrate material and an accelerating voltage, the thickness of the scattering region is appropriately selected, taking these factors into consideration. The mean free pass can be estimated using the equation described in Jpn. J. Appl. Phys., Vol.10, p.678 (1971). The thickness of the scattering region in the mask substrate which is set as described above may be selected to give a beam contrast of preferably at least 90%, more preferably at least 95%, further preferably at least 98% on the wafer. Furthermore, factors associated with manufacturing must be sometimes considered. For example, for a silicon substrate, an aspect ratio of the opening is preferably up to 10, and thus it must be considered when determining the thickness.

In the scattering stencil mask of this invention, there are advantages that processing accuracy may be improved because an opening pattern is formed in a thinner scattering region and that heating of the mask due to electron-beam irradiation is minimized because most of the electron beam penetrates the scattering region. However, if the scattering region in the mask substrate is excessively thin, the mask may be mechanically weak. Thus, as shown in FIG. 10(b), the regions other than the scattering region are preferably thicker than the scattering region for retaining mechanical strength of the mask; specifically, these regions have a thickness preferably at least twice of the scattering region.

In the scattering stencil mask of this invention, for example, when a silicon substrate is employed and an accelerating voltage is 100 kV (an electron penetration depth is about 67 $\mu$m), the thickness of the silicon substrate ranges, for example, 0.2 to 2 $\mu$m. The lower limit of the thickness of the scattering region of the silicon substrate is preferably at least 0.2 $\mu$m, more preferably at least 0.3 $\mu$m, further preferably at least 0.4 $\mu$m, further preferably at least 0.6 $\mu$m. The upper limit is preferably up to 5 $\mu$m, more preferably up to 3 $\mu$m, further preferably up to 2 $\mu$m.

In the scattering stencil mask of this invention, as the scattering region in the mask substrate becomes thinner, the scattering angle of scattered electrons decreases. The thickness of the scattering region must be, therefore, selected as appropriate, for avoiding contrast deterioration due to scattered electrons with a smaller scattering angle passing through the central opening in the limiting aperture, or an electron-beam scattering layer may be deposited on the scattering region in the mask substrate for increasing the scattering angle. The electron-beam scattering layer may be formed on the rear face, the front face or both of the mask. The thickness of the electron-beam scattering layer may be appropriately selected to transmit an adequate amount of electrons and to increase scattering-angle of the electrons while ensuring a linewidth accuracy. For example, when using a heavy metal such as tungsten, the thickness is preferably up to 1 $\mu$m in the light of machining accuracy and at least 10 nm in the light of electron scattering. The electron-beam scattering layer may be made of a heavy metal such as tungsten, chromium, molybdenum, titanium, gold and platinum, or a polycrystal material such as polycrystal silicon, tungsten silicide, molybdenum silicide and titanium silicide. By forming such an electron-beam scattering layer, a mask strength may be improved. Furthermore, the electron-beam scattering layer can be formed to give a relatively large width of the annular opening in the limiting aperture because the scattered electron energy is reduced and the scattering angle becomes wider while the scattered electron density decreases, so that linewidth accuracy of the annular opening in the limiting aperture can be ensured.

It is also essential in the scattering stencil mask of this invention that a mask substrate region corresponding to a back-scattering range for image-forming electrons in the wafer (hereinafter, referred to as a "back-scattering substrate region") is thinner than the electron penetration depth. In other words, the scattering region in the mask substrate must be formed, including the back-scattering substrate region. If electrons does not penetrate or inadequate scattered electrons are generated in the back-scattering substrate region, proximate effect cannot be satisfactorily corrected. As described above, since the scattered electrons must be defocused to about the back-scattering range to be irradiated as a correction beam, the scattering electrons must be emitted from at least the mask substrate region corresponding to the back-scattering range, i.e., from the back-scattering substrate region.

Figure 11:
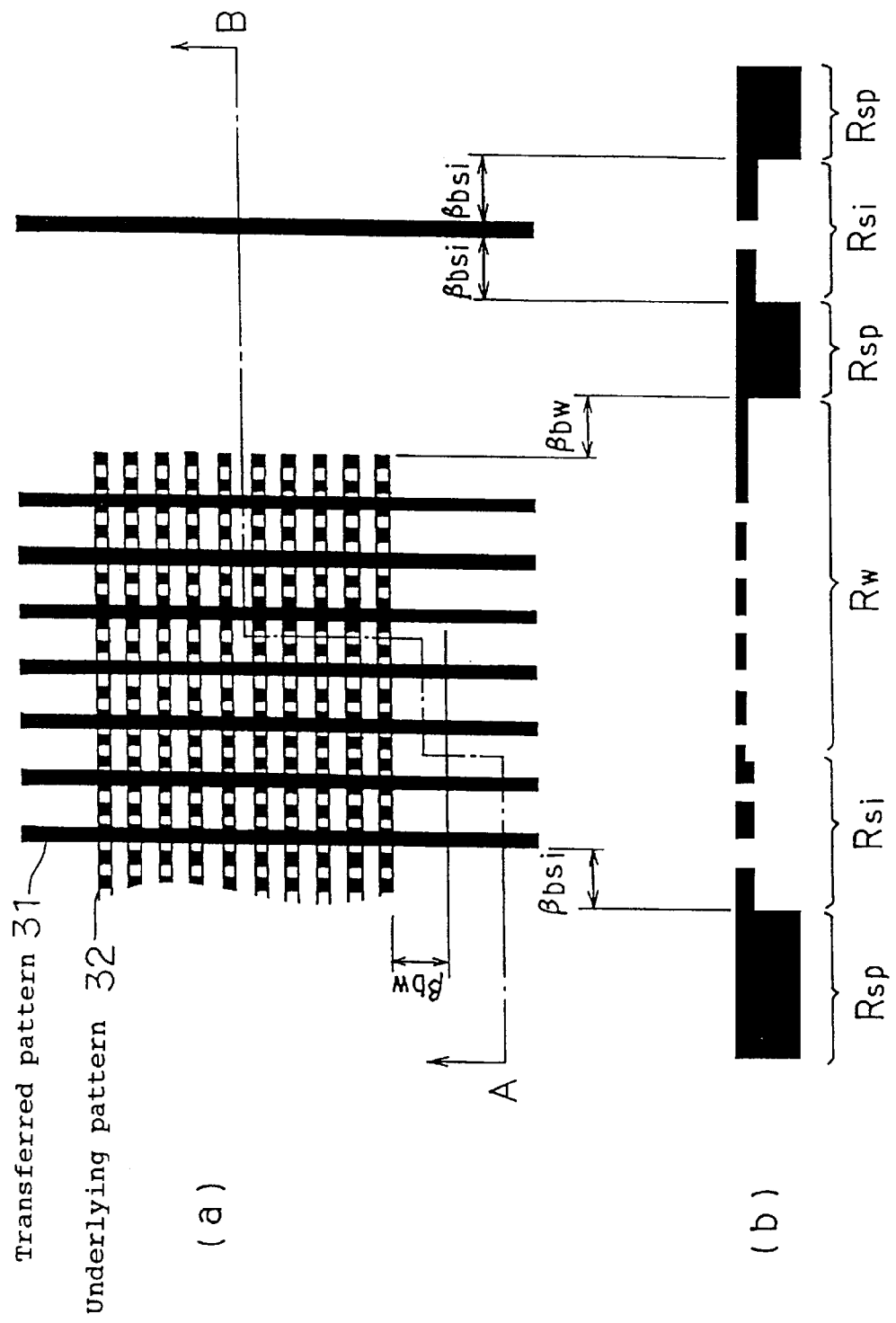
FIG. 11 illustrates the structure of an electron-beam exposure mask of this invention.

With reference to FIG. 11, another embodiment of the electron-beam exposure mask (scattering stencil mask) will be described. FIG. 11(a) shows a transferred pattern 31 for a line-and-space and an underlying pattern 32 comprising, for example, a gate and an interconnection in the cell made of a material having a higher density than the wafer material and a filling-up part of a contact hole, while FIG. 11(b) shows a cross section of the mask taken on line A–B in FIG. 11(a). In these figures, $\beta b_{Si}$ is a back-scattering range due to the silicon substrate and $\beta b_W$ is the back-scattering range to which the underlying pattern further contributes. The ratio of the transferred pattern size:the mask size is set to 1:1 to clearly indicate a relationship between the transferred pattern and the mask. The heavy material constituting the underlying pattern may be a heavy metal such as tungsten, copper, tantalum, cobalt, titanium and molybdenum. The transferred pattern 31 for the above line-and-space corresponds to, for example, an upper layer pattern such as a bit line and an aluminum interconnection.

In this embodiment, since it is taken into consideration that a back-scattering coefficient $\eta$ and a back-scattering range $\beta b$ vary depending on the type of the material, a linewidth for the transferred pattern can be more accurately controlled.

In this embodiment, a region with a different mask thickness is formed, considering the back-scattering to which the substrate material as well as the underlying pattern contribute. The thickness of the region with a different mask thickness may be selected in accordance with the back-scattering coefficients of the substrate material and the underlying pattern. Furthermore, the thickness of the region with a different mask thickness is selected, considering not only the region corresponding to the underlying pattern region but also the region corresponding to the back-scattering range to which the underlying pattern contributes.

As shown in FIG. 11, the mask thickness is thinnest in the region $R_W$ where the underlying pattern 32 contributes to the back-scattering, while being slightly thicker in the region $R_{Si}$ where there is no contribution by the underlying pattern 32. Both regions $R_W$ and $R_{Si}$ are thinner than the electron penetration depth, for transmitting and scattering the electron beam, while the other region $R_{SP}$ is thicker than them, for keeping mechanical strength of the mask. The region $R_W$ is thinner than the region $R_{Si}$ for irradiating the wafer with a more correction dose in order to compensate the increase of energy deposition due to back-scattering to which the underlying pattern contributes. Thus, the mask substrate region corresponding to the back-scattering region to which the underlying pattern contributes may be made thinner, to correct proximity effect to which the back-scattering due to the underlying pattern contributes, and to further improve linewidth accuracy in the resist pattern after development.

In the embodiment shown in FIG. 11, to partially adjust the correction-beam dose irradiated on the wafer, scattered electrons are partially controlled by partially changing the thickness of the scattering region in the mask substrate in accordance with the back-scattering to which the underlying pattern contributes. Instead of changing the thickness of the scattering region in the mask substrate, an alternative method may be used to partially adjusting a correction dose, in which an electron-beam scattering layer is partially formed on the scattering region to partially control the correction dose. For example, in FIG. 11, the thickness of the total scattering regions ($R_W$, $R_{Si}$) is optimized for the region $R_W$ corresponding to the back-scattering region to which the underlying pattern contributes, and an electron-beam scattering layer is formed on the region $R_{Si}$ i.e., the other scattering region other than the region $R_W$ corresponding to the back-scattering region to which the underlying pattern contributes. The electron-beam scattering layer may allow the scattering angle of scattered electrons to increase, so that electrons passing through the limiting aperture decrease and thus the correction dose can be partially reduced. The electron-beam scattering layer may be made with the material and the thickness as in the embodiment shown in FIG. 10.

The electron-beam exposure mask may be prepared by applying any of various conventional manufacturing processes for a stencil mask used for a cell-projection type of electron-beam exposure system.

A conventional process for manufacturing a stencil mask will be described with reference to FIG. 12, and then an embodiment of the process for an electron-beam exposure mask (a scattering stencil mask) of this invention will be described.

First, on a composite wafer 44 (Si/SiO$_2$/Si), a resist layer is formed and then patterned by lithography, as shown in FIG. 12(a), where 41 and 43 represent the Si layers and 42 represents the SiO$_2$ layer.

As shown in FIG. 12(b), the Si layer 43 is dry-etched using the patterned resist layer 45 as a mask.

Then, after removing the resist layer, a silicon nitride film 46 is formed as a protective layer for the subsequent wet-etching step, as shown in FIG. 12(c). Then, on the rear face, a resist layer is formed and patterned to form a resist layer 47 with an opening window in its center.

Then, as shown in FIG. 12(d), the exposed silicon nitride film and Si layer 41 in the opening are wet-etched by an alkali solution such as a potassium hydroxide solution. The tapered shape of the formed Si layer 41 is due to the orientation of the Si layer. Then, the exposed SiO$_2$ film is removed by wet-etching.

Then, as shown in FIG. 12(e), the resist layer 47 and the protective film 46 are removed, and a conduction film 48 made of, for example, gold, platinum or palladium is formed on the surface by an appropriate technique such as spattering.

The electron-beam exposure mask (scattering stencil mask) of this invention can be prepared by applying the above manufacturing process.

To partially change the thickness of the scattering region in the mask, the Si layer may be selectively removed by irradiating with an ion beam from the rear face after forming the mask. Alternatively, after the step in FIG. 12(d), the resist layer 47 and the protective film 46 are removed and then an ion beam is irradiated from the front face to selectively remove the Si layer prior to forming the conduction film 48 on the surface.

Figure 13:
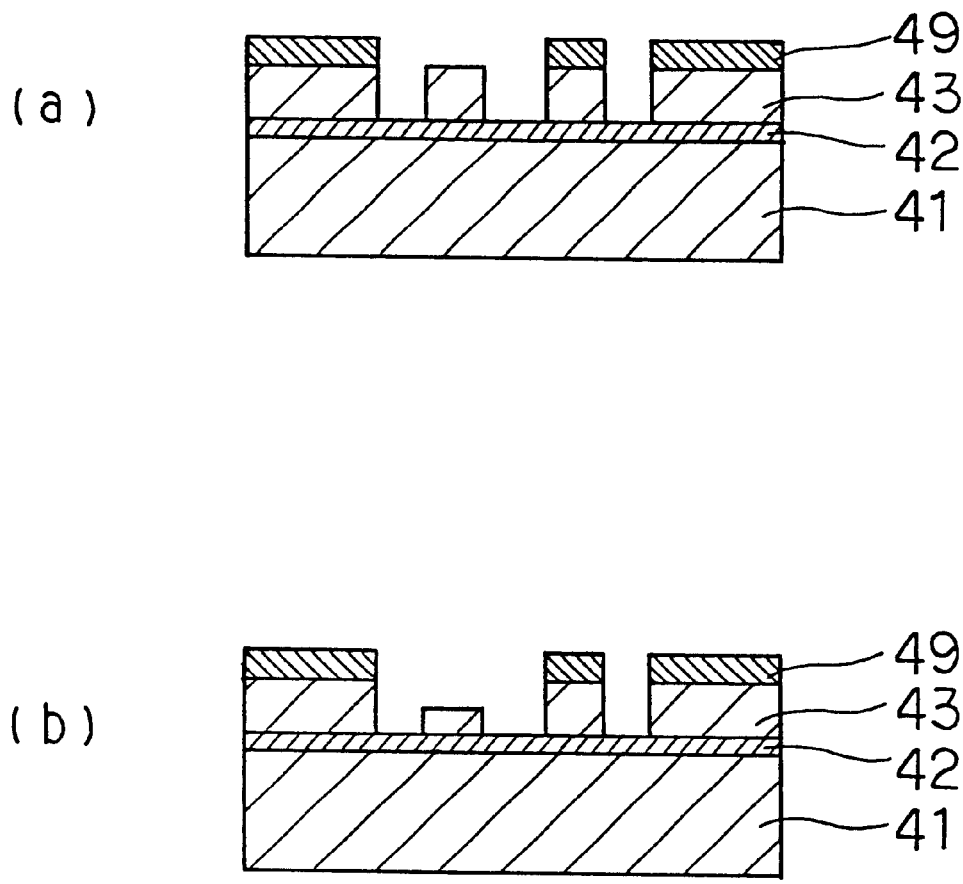
FIG. 13 is a process cross section for illustrating a process for manufacturing an electron-beam exposure mask of this invention.

Alternatively, for example, after the step in FIG. 12(b), the resist layer 45 is removed and then a resist layer is formed and patterned by lithography (FIG. 12(a)). Then, the product is dry-etched using the patterned resist layer 49 as a mask, to partially form a thinner region (FIG. 13(b)). Alternatively, after the step in FIG. 12(d), the resist layer 47 and the protective film 46 are removed and then as described above, a resist layer is formed and patterned by lithography and then the product is dry-etched using the patterned resist layer 49 as a mask, to partially form a thinner region before forming a conduction film 48 on the surface.

An electron-beam scattering film may be partially formed on the scattering region in the mask, for example, as follows.

After the step in FIG. 12(d), the resist layer 47 and the protective film 46 are removed. Then, a resist layer is formed and patterned by lithography (FIG. 14(a)); an electron-beam scattering film 51 is formed on the patterned resist layer 50 (FIG. 15(b)); and the electron-beam scattering film 51 on the resist layer 50 is removed together with the resist layer 50 to partially provide an electron-beam scattering film (FIG. 14(c)) before forming the conduction film 48 on the surface.

Figure 15:
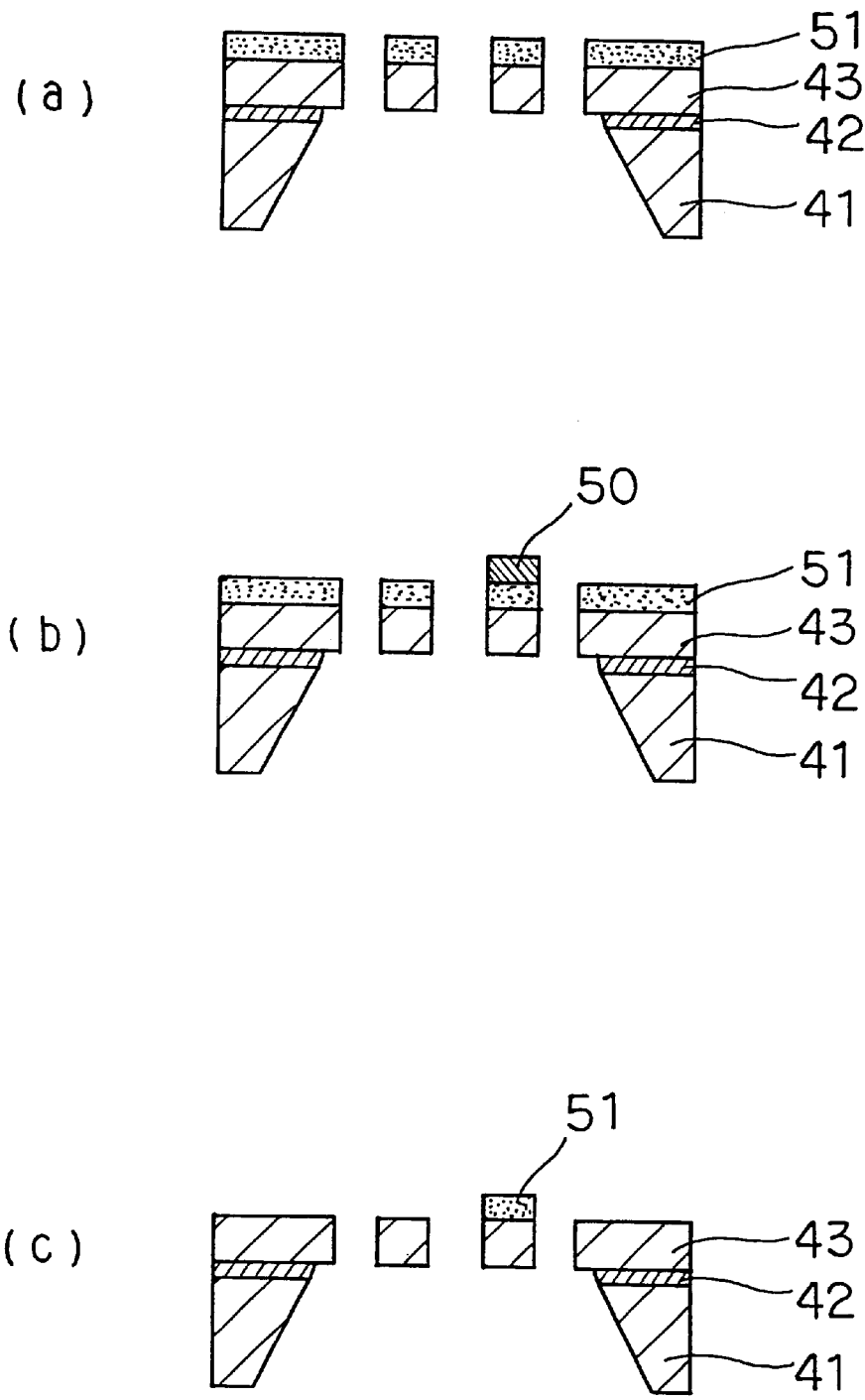
FIG. 15 is a process cross section for illustrating a progress for manufacturing an electron-beam exposure mask of this invention.

Alternatively, for example, after the step in FIG. 12(d), the resist layer 47 and the protective film 46 are removed; an electron-beam scattering film 51 is formed on the surface (FIG. 15(a)); a resist layer is formed and patterned by lithography (FIG. 15(b)); the product is etched using the patterned resist layer 50 as a mask to remove the unnecessary electron-beam scattering film; and then the resist layer 50 is removed to partially provide an electron-beam scattering film (FIG. 15(c)) before forming the conduction film 48 on the surface.

What is claimed is:

1. A scattering-angle limiting type of electron-beam exposure system having a mask comprising a scattering region and a limiting aperture which limits the amount of scattered electrons passing through the mask, comprising a first limiting aperture fixed at or near a crossover plane and having a central opening and a closed elongated opening surrounding the central opening; and a second limiting aperture shiftable along an optical axis and having a central opening and a closed elongated opening surrounding the central opening.

2. A scattering-angle limiting type of electron-beam exposure system as claimed in claim 1, where the mask comprises a pattern consisting of an electron-beam scatterer formed on an electron-beam transmittable film.

3. A scattering-angle limiting type of electron-beam exposure system as claimed in claim 1, where the mask has an opening pattern consisting of an opening in its region thinner than an electron penetration depth.

4. A scattering-angle limiting type of electron-beam exposure system as claimed in claim 1, comprising
a limiting-aperture changing member in which are disposed or fabricated a plurality of limiting apertures different in the size of the closed elongated opening surrounding the central opening; and
a mechanism which operates the limiting-aperture changing member to dispose a desired aperture as the first limiting aperture among the plurality of limiting apertures in the optical system.

5. A scattering-angle limiting type of electron-beam exposure system as claimed in claim 1, comprising
a limiting aperture (A) having an opening only in its center and fixed in the optical system, in place of the first limiting aperture;
a limiting-aperture changing member in which are disposed or fabricated a plurality of limiting apertures (B) having an opening in their center with a size different from each other and larger than the outer diameter of the limiting aperture (A); and
a mechanism which operates the limiting-aperture changing member to dispose a desired limiting aperture (B) among the plurality of limiting apertures (B) on the axis of the limiting aperture (A).

6. A scattering-angle limiting type of electron-beam exposure system as claimed in claim 1, comprising
a first limiting-aperture changing member comprising a plurality of limiting apertures (A) having an opening in their center, with a outer diameter different from each other only, in place of the first limiting aperture;
a second limiting-aperture changing member in which are disposed or fabricated a plurality of limiting apertures (B) having an opening in their center with a size different from each other and larger than the outer diameters of the limiting apertures (A); and
a mechanism which operates the first and the second limiting-aperture changing members to dispose a desired limiting aperture (A) among the plurality of limiting apertures (A) and a desired limiting aperture (B) among the plurality of limiting apertures (B) on the same axis in the optical system.

7. A scattering-angle limiting type of electron-beam exposure system having a mask comprising a scattering region and a limiting aperture which limits the amount of scattered electrons passing through the mask, where the limiting aperture comprises a central opening and a closed elongated opening surrounding the central opening, and comprising
a limiting-aperture changing member in which are disposed or fabricated a plurality of limiting apertures different in the size of the closed elongated opening; and
a mechanism which operates the limiting-aperture changing member to dispose a desired aperture among the plurality of limiting apertures in the optical system.

8. A scattering-angle limiting type of electron-beam exposure system having a mask comprising a scattering region and a limiting aperture which limits the amount of scattered electrons passing through the mask, comprising
a first limiting aperture having an opening only in its center and fixed in the optical system;
a limiting-aperture changing member in which are disposed or fabricated a plurality of second limiting apertures having an opening in their center with a size different from each other and larger than the outer diameter of the first limiting aperture; and
a mechanism which operates the limiting-aperture changing member to dispose a desired second limiting aperture among the plurality of second limiting apertures on the axis of the first limiting aperture.

9. A scattering-angle limiting type of electron-beam exposure system having a mask comprising a scattering region and a limiting aperture which limits the amount of scattered electrons passing through the mask, comprising
a first limiting-aperture changing member comprising a plurality of first limiting apertures having an opening only in their center, with a outer diameter different from each other;
a second limiting-aperture changing member in which are disposed or fabricated a plurality of second limiting apertures having an opening in their center with a size different from each other and larger than the outer diameters of the first limiting apertures; and
a mechanism which operates the first and the second limiting-aperture changing members to dispose a desired first limiting aperture among the plurality of first limiting apertures and a desired second limiting aperture among the plurality of second limiting apertures on the same axis in the optical system.

10. A scattering-angle limiting type of electron-beam exposure process using the scattering-angle limiting type of electron-beam exposure system as claimed in claim 1, comprising the step of
shifting the second limiting aperture along the optical axis as long as the limiting aperture does not block the center of the electron-beam trajectory forming an image corresponding to the outermost periphery of the pattern on the mask, to adjust the amount of scattered electrons passing through the openings of the first and the second limiting apertures for controlling a correction dose and correcting proximity effect simultaneously with the pattern exposure.

11. A scattering-angle limiting type of electron-beam exposure process as claimed in claim 10 where the correction dose is further adjusted by shifting the crossover plane along the optical axis by changing the excitation of the projection lens.

12. An electron-beam exposure mask used in a scattering-angle limiting type of electron-beam exposure process comprising the step of using a mask having a scattering region to perform pattern exposure by means of a scattering contrast induced by difference in electron-beam scattering while utilizing a part of the scattered electrons by the mask to correct proximity effect, where
a mask substrate has a scattering region with a thickness shorter than an electron penetration depth, which includes a region corresponding to a back-scattering range of the image-forming electrons in the wafer; and
a patterned opening is formed in the scattering region.

13. An electron-beam exposure mask as claimed in claim 12 where the region other than the scattering region is thicker than the scattering region for maintaining the mechanical strength of the mask.

14. An electron-beam exposure mask as claimed in claim 12 where an electron scattering layer is formed at least in the scattering region in the mask substrate.

15. An electron-beam exposure mask as claimed in claim 12 where the thickness of the scattering region varies depending on back-scattering to which the underlying pattern of the wafer contributes.

16. An electron-beam exposure mask as claimed in claim 12 where in the scattering region, an electron-beam scattering layer is formed on the region other than that corresponding to the back-scattering region to which the underlying pattern of the wafer contributes.

17. An electron-beam exposure mask as claimed in claim 12 where the mask substrate is made of silicon.

18. A scattering-angle limiting type of electron-beam exposure system comprising a mask as claimed in claim 12; and a limiting aperture in which are formed a central opening and a closed elongated opening surrounding the central opening to limit the amount of mask-scattered electrons passing through the mask, which can utilize a part of the scattered electrons to correct proximity effect simultaneously with pattern exposure.

19. A scattering-angle limiting type of electron-beam exposure process comprising the step of using a mask having a scattering region to perform pattern exposure by means of a scattering contrast induced by difference in electron-beam scattering while utilizing a part of the scattered electrons by the mask to correct proximity effect, where the mask is prepared by forming a scattering region on a mask substrate, with a thickness shorter than an electron penetration depth, which includes a region corresponding to a back-scattering range of the image-forming electrons in the wafer; and forming a patterned opening in the scattering region.

20. An electron-beam exposure process as claimed in claim 19 where the thickness of the scattering region varies depending on back-scattering to which the underlying pattern of the wafer contributes.

21. An electron-beam exposure process as claimed in claim 19 where in the scattering region, an electron-beam scattering layer is formed on the region other than that corresponding to the back-scattering region to which the underlying pattern of the wafer contributes.

* * * * *